United States Patent [19]

Isohata et al.

[11] 4,422,754
[45] Dec. 27, 1983

[54] PROJECTION-PRINTING APPARATUS

[75] Inventors: Junji Isohata, Tokyo; Hironori Yamamoto, Chigasaki, both of Japan

[73] Assignee: Canon Kabushiki Kaisha, Tokyo, Japan

[21] Appl. No.: 340,843

[22] Filed: Jan. 20, 1982

[30] Foreign Application Priority Data

Aug. 8, 1981 [JP] Japan .................................. 56-124212

[51] Int. Cl.³ ...................... G03B 27/52; G03B 27/70
[52] U.S. Cl. ....................................... 355/43; 355/53; 355/73; 355/76
[58] Field of Search .................. 355/40, 41, 43, 45, 355/65, 66, 73, 76, 53

[56] References Cited

U.S. PATENT DOCUMENTS

| 3,722,996 | 3/1973 | Fox ........................................ 355/53 |
| 3,984,186 | 10/1976 | Momose et al. ....................... 355/45 |
| 4,040,736 | 8/1977 | Johannsmeier ......................... 355/43 |
| 4,346,987 | 8/1982 | Jalichandra et al. .................. 355/40 |

*Primary Examiner*—Richard A. Wintercorn
*Attorney, Agent, or Firm*—Fitzpatrick, Cella, Harper & Scinto

[57] ABSTRACT

A projection-printing apparatus moves at least one of a mask and a wafer with precise rectilinearity along a guide relative to an optical system for projecting the image of the mask upon the wafer, and in a plane perpendicular to the optical axis of the optical system whereby the image of the mask is printed on the wafer.

2 Claims, 11 Drawing Figures

PROJECTION-PRINTING APPARATUS

BACKGROUND OF THE INVENTION

1. Field of the Invention

This invention relates to a projection-printing apparatus for use in the manufacture of elements of semiconductor circuits such as IC, LSI, super-LSI, etc. More particularly this invention relates to a printing apparatus which uses an imaging optical system for forming the image of a part or all of a mask on a wafer and in which the mask and the wafer together are moved or only one of them is moved relative to the imaging optical system to thereby project the image of the mask upon the wafer.

2. Description of the Prior Art

The assignee of the present invention has already proposed a printing apparatus in which the image of a part of a mask is formed on a wafer and the mask is moved relative to an imaging optical system (Japanese Patent Application Laid-Open No. 53867/1979 laid open on Apr. 27, 1979). Also known is a so-called stepper projection-printing apparatus in which a reduced image of the whole of a mask is formed on a wafer and the mask is moved in stepwise fashion relative to the imaging optical system, whereby multiple mask images are printed on the wafer.

In such scanning type projection-printing apparatus, it is necessary to control a driven member with guide means.

For this purpose, for example, in the moving mechanism of the projection-printing apparatus of the aforementioned Japanese Patent Application Laid-open No. 53867/1979, a mask supporter and a wafer supporter integrally coupled together are movably supported on two guide rails and moved along these guide rails. Accordingly, when these guide rails are not accurately aligned or are not rectilinearly accurate, the mask and wafer are spatially inclined in two dimensions relative to the optical system and spatial deviation of the mask image occurs. Therefore, the accuracy of the rectilinearity of the two guide rails must be strictly controlled.

Also, even if the guide rails are manufactured with high precision, they may deviate from their original precise form with lapse of time.

SUMMARY OF THE INVENTION

In view of the above-noted points, it is an object of the present invention to provide a projection-printing apparatus in which a mask, a wafer and an imaging optical system can be accurately moved even if there is a problem with the precision of guide rails. This object can be achieved by providing a plurality of foating elements on a sliding member movable along the guide rails, controlling the floating forces of these floating elements and changing the attitude of the sliding member, thereby compensating for the non-rectilinearity of the guide rails. Accordingly, in projection-printing apparatus of the present invention, no pitching and yawing occur in movement of the mask, wafer, imaging system, etc. and a good mask image can be formed on the wafer.

The invention will become more fully apparent from the following detailed description thereof taken in conjunction with the accompanying drawings.

DESCRIPTION OF THE PREFERRED EMBODIMENT

Figure 1:
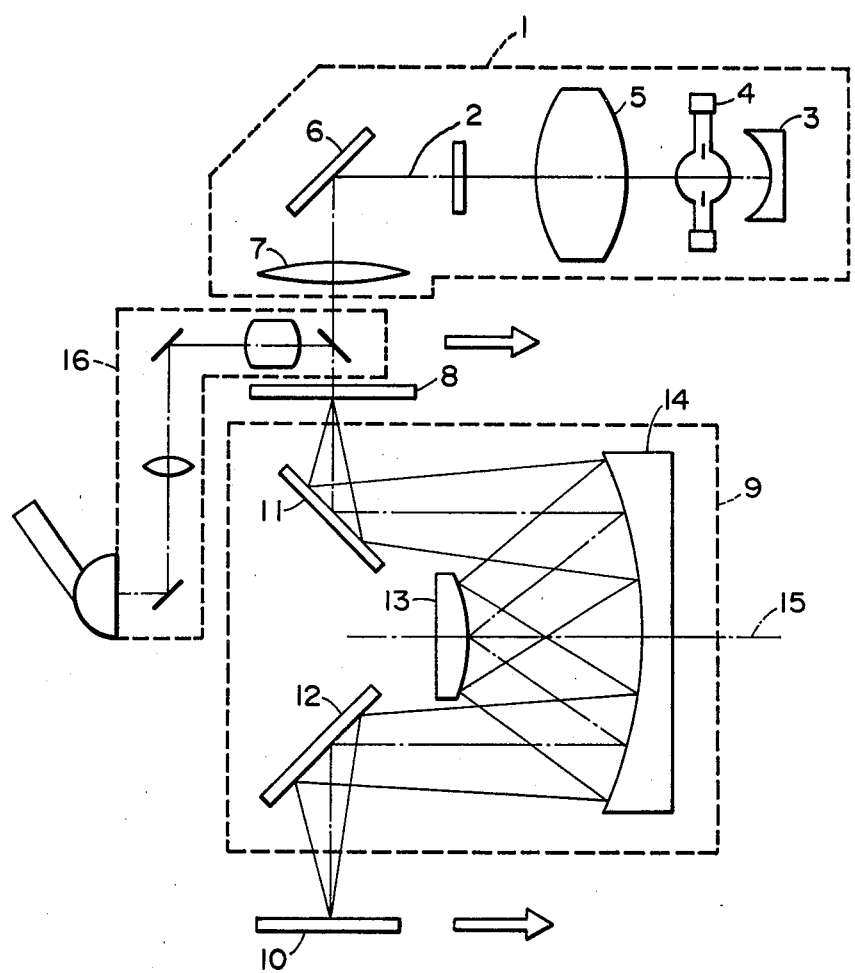
FIG. 1 shows the optical arrangement of the apparatus according to the present invention.

Referring to FIG. 1 which shows the optical arrangement of the apparatus according to the present invention, reference numeral 1 designates a mask illuminating light source optical system which comprises a spherical mirror 3, an arcuate mercury lamp 4, a lens 5, a 45° mirror 6 and a lens 7 disposed along optical axis 2. Although not shown, this light source optical system has a filter for eliminating light having sensitivity to a wafer. This filter may be inserted into the illuminating optical path during alignment of a mask and wafer. Designated by 8 is a mask disposed in an upper horizontal plane. This mask 8 is held by a conventional mask holder (not shown). Denoted by 9 is a mirror imaging optical system for forming the image of the mask 8 on the wafer 10. The mirror imaging optical system comprises two 45° mirrors 11, 12, a convex mirror 13 and a concave mirror 14. Reference numeral 15 designates the common optical axis of the convex and concave mirrors 13 and 14. The optical axis 15 is parallel to upper and lower horizontal planes. Details of the mirror imaging optical system are described in Japnese Patent Publication No. 12039/1973 and therefore the description thereof is omitted herein. The wafer 10 is held by a conventional wafer holder. This wafer holder, as is conventional, can be finely adjusted in the directions X, Y and $\theta$. Designated by 16 is a microscope optical system which may be inserted into the optical path between the lens 7 and the mask 8 during alignment to judge whether the mask 8 and the wafer 10 are in a predetermined positional relation. When the mask 8 and the wafer 10 are not in the predetermined relation, the wafer is adjusted and moved relative to the mask by the X, Y, $\theta$ adjusting mechanism of the aforementioned wafer holder to bring the wafer and mask into the predetermined relation.

Figure 2:
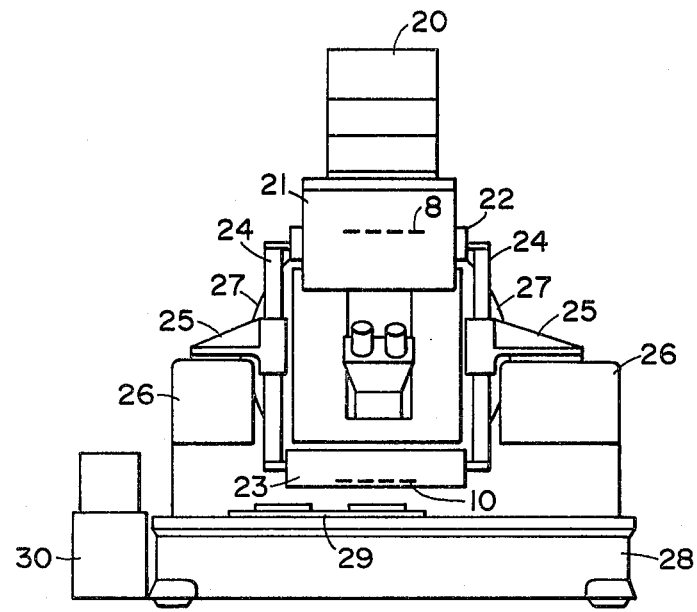
FIG. 2 shows the appearance of the apparatus according to the present invention.

Reference is now had to FIG. 2 which shows the appearance of the apparatus of the present invention. In FIG. 2, reference numeral 20 designates a lamp housing in which the illuminating optical system of FIG. 1 is disposed. Denoted by 21 is a unit in which a microscope for alignment is disposed. This unit is supported for movement back and forth in the direction of the optical axis 15 of FIG. 1. Reference numeral 22 designates a mask supporter and reference numeral 23 denotes a wafer supporter. These supporters 22 and 23 are connected for movement together by a coupling member 24. It should be noted that the supporters 22 and 23 are movable together while the wafer is finely movable relative to the supporter 23. Designated by 25 is an arm fixed to the coupling member 24. This arm 25 is supported by guide means 26 through fluid bearings. Accordingly, the mask and wafer supporters 22 and 23 may be horizontally and rectilinearly moved together along the guide means 26. Designated by 27 is a barrel containing the mirror imaging optical system therein. Reference numeral 28 designates a base, reference numeral 29 denotes a turn table, and reference numeral 30 designates an autofeeder. By this autofeeder, the wafer is automatically supplied onto the wafer supporter through the turn table 29.

Figure 3:
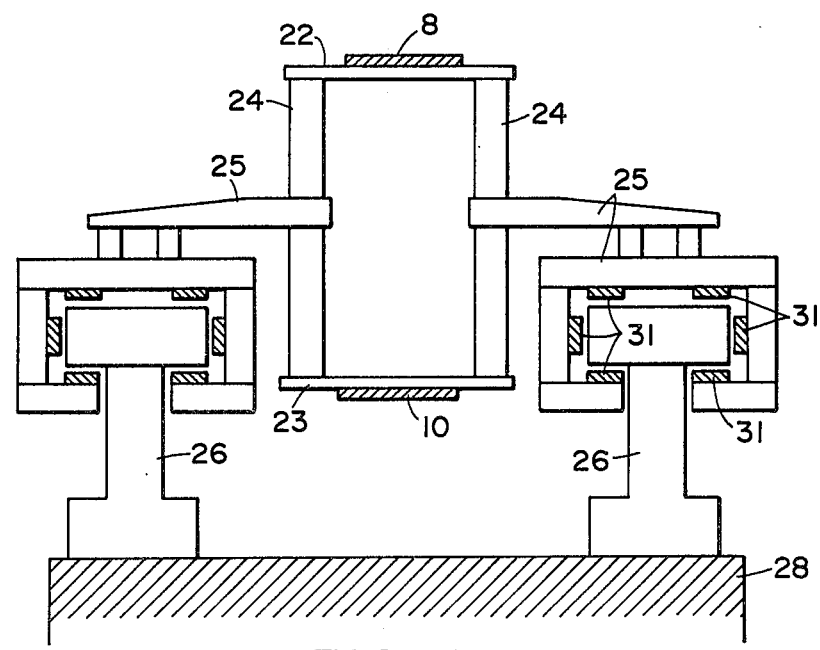
FIG. 3 is a cross-sectional view of the FIG. 2 apparatus.

FIG. 3 shows a schematic cross-sectional view of the FIG. 2 arrangement. Each arm 25 floats on a guide member 26 through a pneumatic bearing. Designated by 31 are the pads of the pneumatic bearing. These pads are connected to a high pressure air source, not shown, to discharge high pressure air therethrough.

Figure 4:
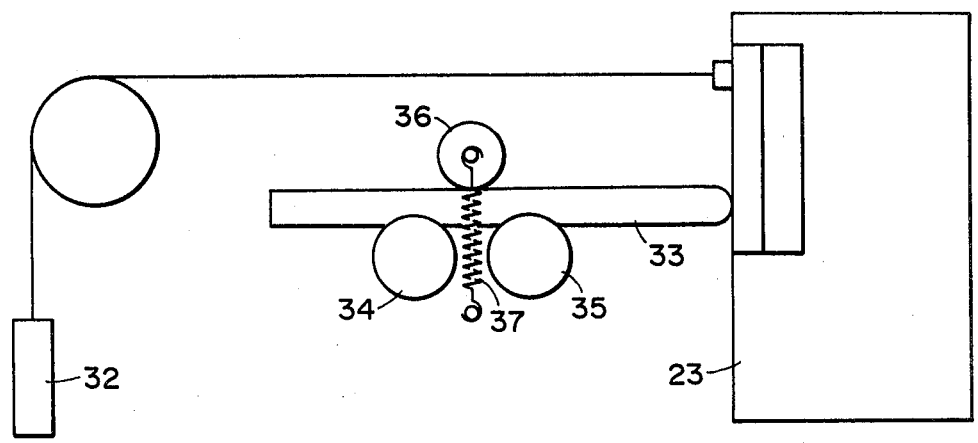
FIGS. 4 and 5 show a moving mechanism.
Figure 5:
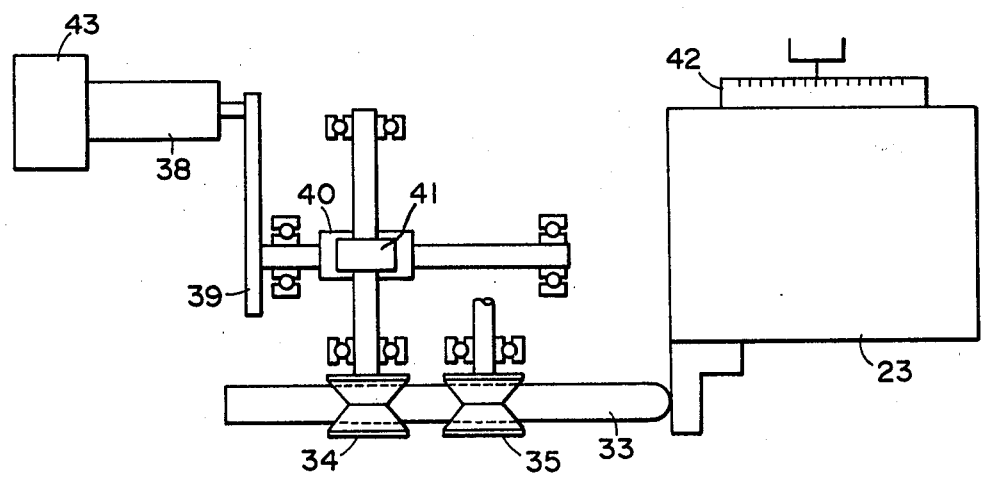

FIGS. 4 and 5 show a mechanism for moving the floating mask and wafter supporters 22 and 23 along the guide member 26. The mask and wafer supporters 22 and 23 are pulled leftwardly by a weight 32 as viewed in FIG. 4. Denoted by 33 is a driving bar for moving the mask and wafer supporters 22 and 23 rightwardly. This driving bar 33 is moved rightwardly by a driving roller 34. Designated by 35 and 36 are guide rollers. The roller 36 is pulled toward the driving roller by a spring 37.

The driving roller 34 is driven by a motor 38 shown in FIG. 5. The rotational force of the motor 38 is transmitted to the driving roller through a belt and pulley 39, a worm 40 and a gear 41. The speed of the motor 38 is controlled by a position detecting magnescale and rotary encoder 43 mounted on the mask and wafer supporters 22 and 23.

The guide member and sliding member will now be described in greater detail with reference to FIGS. 6 and so on.

Figure 6:
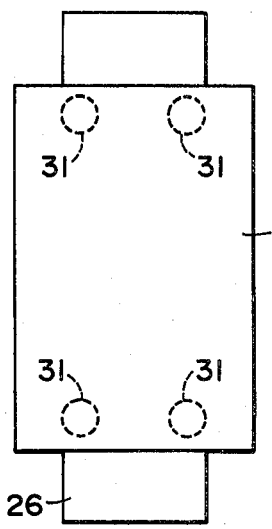
FIG. 6 shows guide rails and a sliding member.

As shown in FIG. 6, two pads 31 each are disposed forwardly and rearwardly on the sliding member 50 of the arm 25. For simplicity of description, control of the attitude in the pitching direction by control of the air pressure supplied to the forward and rearward pads 31 will be explained by way of example.

The gap between the pads 31 and the guide 26 is determined by the air pressure supplied to the pads and the weight of the moving part. Where the weight of the moving part does not change, if the air pressure supplied is increased, the gap will become wider and if the air pressure supplied is decreased, the gap will become narrower. The present invention utilizes this principle.

Figure 7:
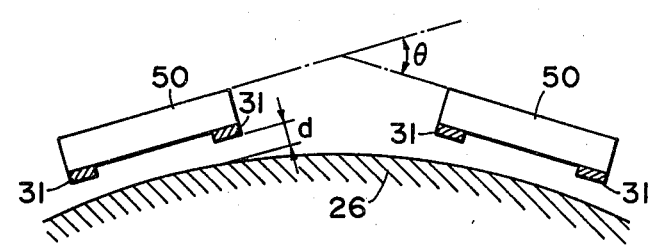
FIG. 7 shows the manner of movement of the sliding member when curvature is present in the guide rails.

FIG. 7 shows the behavior of the sliding member 50 when the control of the present invention is not effected. If there is no fluctuation of the air pressure supplied, the gad d between the pads and the guide is always constant independently of the movement position. Therefore, the accuracy of movement of the bearing is determined by the accuracy of the guide. Accordingly, in the case of FIG. 7, the sliding members 50 effect convexly curved movement along a convexly curved guide rail 26.

Figure 8:
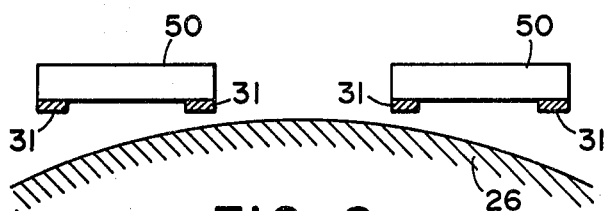
FIGS. 8 and 9 show the manner of movement of the sliding member of the present invention.
Figure 9:
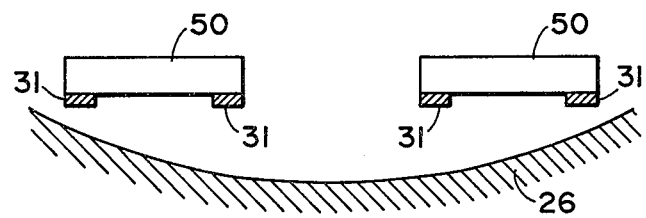

FIG. 8 shows the behavior of the sliding member 50 when the control of the present invention is effected. Where the shape of the guide 26 is convexly curved, the air pressure supplied to the rearward pads is made high and the air pressure supplied to the forward pads is made low at the movement starting position, and with the movement, the air pressure supplied to the rearward pads is made lower and the air pressure supplied to the forward pads is made higher. Thereupon, the finite pitching angle $\theta$ shown in FIG. 7 which results when control is not effected, can be modified to O by control in accordance with the invention.

Where the shape of the guide is concavely curved as shown in FIG. 9, the air pressure supplied to the rearward pads may be made low and the air pressure supplied to the forward pads may be made high at the movement starting position, and with the movement, the air pressure supplied to the rearward pads may be made higher and the air pressure supplied to the forward pads may be made lower. Where the shape of the guide is repetitively concavo-convex, the controls shown in FIGS. 7 and 8 may be alternately effected.

Three methods of control of the air pressure supplied to the pads will now be described.

Figure 10:
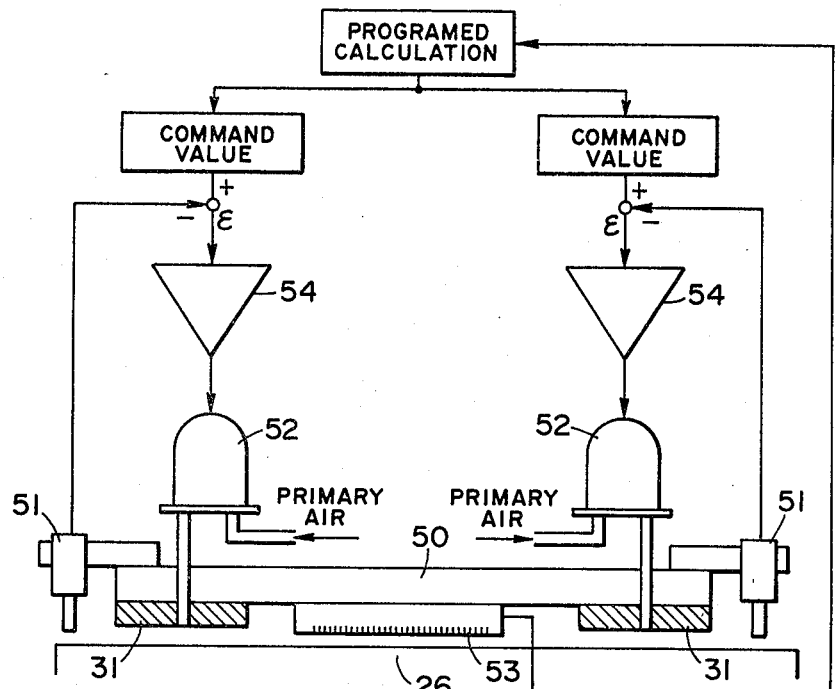
FIGS. 10 and 11 are block diagrams of devices for controlling the attitude of the sliding member.

FIG. 10 is a block diagram illustrating a first method of directly measuring the gap between the pads and the guide by means of an electric micrometer 51 and controlling the attitude. Here, command values are the values indicating what voltage of the electric micrometer is necessary to control the attitude depending on the movement position, by measuring in advance the relation between the position and attitude of the sliding member 50. A servo valve 52 is a nozzle flapper type flow rate valve which can vary the secondary side pressure in accordance with the current value even if the primary side pressure is constant. The electric micrometer 51 is an air-capacity type non-contact electric micrometer having an output of 25 $\mu$m/10 V.

The control method thereof will now be described in detail. The present position of the moving member 50 is detected by a magnescale 53 and the predetermined control amount of that position is converted into the voltage of the electric micrometer 51 and a command indicating how many volts is necessary is put out. If that command value is not being put out from the electric micrometer, the difference from the command value is passed through amplifiers 54 to operate the servo valves 52 to thereby increase or decrease the supply air pressure to the pads 31 and set the attitude of the moving member 50 to a target value.

Figure 11:
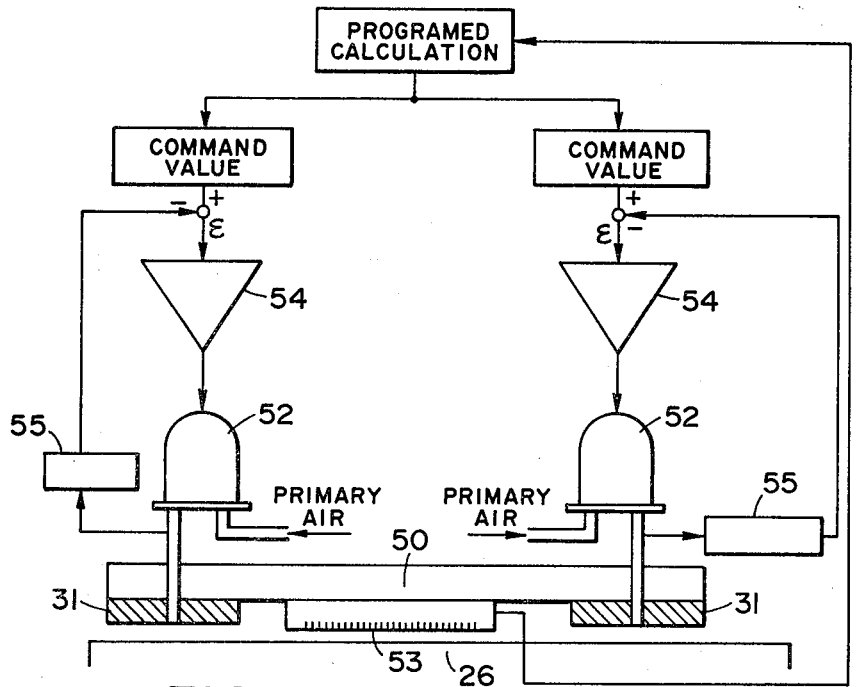

FIG. 11 is a block diagram illustrating a second method of directly setting the air pressure supplied to the pads and of controlling the attitude of the sliding member 50. This method differs from the first method only in that the electric micrometers have been replaced by pressure sensors 55. A third method is an attidue control method of detecting the attitude of the moving member by the current information from a measurer (laser interference, autocollimator or the like) and controlling the attitude by a flow rate servo valve.

Operation of this apparatus will now be described.

First, alignment of the mutual positional relation between the mask 8 and the wafer 10 is effected. During this alignment, the aforementioned filter is inserted into the light source optical system 1 and a sector-shaped light source image is formed on the mask by non-sensitive light passed through the lenses 5 and 7. Also, in this case, the microscope optical system 16 is inserted between the lens 7 and the mask 8. Alignment marks on the mask and wafer 8 and 10 are observed through the microscope 16 and adjustment of the two alignment marks is effected by operating the wafer supporter. After the alignment of the mask and wafer has been terminated, the aforementioned filter and microscope 16 are retracted from the optical path. Simultaneously therewith, the light source 4 is turned off or intercepted by shutter means, not shown. Subsequently, the light source 4 is turned on or the shutter is opened, whereby a sensitive sector-shaped light source image is formed on the mask. The mask image on the portion illuminated by this sector-shaped light source image is formed on the wafer by reflection imaging optical systems 13 and 14. In this condition, the motor 38 revolves to move the driving bar 33 at a constant speed. Thereby, the mask and wafer supporters 22 and 23 are moved along the guide portions 26. Even if, in this case, there is a problem in the accuracy of the left-hand guide 26, no pitching and rolling occur because the air pressures supplied to the pads of each sliding member are individually controlled by the previously described method in accordance with the curvature of that guide. By this movement, the entire image of the mask is projected upon the wafer.

While the foregoing embodiment has been described by taking a pneumatic floating element as an example, the pneumatic floating element may be replaced by a magnetic floating element.

What we claim is:

1. A projection-printing apparatus for printing the image of a mask on a wafer, said apparatus comprising:

an imaging optical system for projecting the image of the mask upon the wafer;

means for moving at least one of the mask and the wafer relative to said imaging optical system in a plane perpendicular to the optical axis of said imaging optical system, said moving means including a guide member, a sliding member for carrying at least one of the mask and the wafer and being movable relative to said guide member, and at least one floating element provided on said sliding member for floatingly mounting said sliding member on said guide member for said relative movement;

means for detecting irregularities in said guide member; and means for individually controlling the floating forces of each said floating element to compensate for irregularities in said guide member detected by said detecting means.

2. A projection-printing apparatus according to claim 1, wherein said each said floating element is of pneumatic type.

* * * * *